(12) United States Patent
Hopkins

(10) Patent No.: US 8,787,705 B1
(45) Date of Patent: Jul. 22, 2014

(54) SYSTEM AND METHOD FOR MANAGING DIGITAL DATA

(71) Applicant: Richard Hopkins, Denton, TX (US)

(72) Inventor: Richard Hopkins, Denton, TX (US)

(\*) Notice: Subject to any disclaimer, the term of this patent is extended or adjusted under 35 U.S.C. 154(b) by 75 days.

(21) Appl. No.: 13/630,448

(22) Filed: Sep. 28, 2012

Related U.S. Application Data

(60) Provisional application No. 61/540,927, filed on Sep. 29, 2011.

(51) Int. Cl.
*G06K 9/60* (2006.01)

(52) U.S. Cl.
USPC ............ 382/305; 382/232; 382/233; 382/276

(58) Field of Classification Search
USPC .......... 382/232, 233, 276, 305; 358/403, 404; 711/5, 170, 105; 347/116, 262; 710/309, 240; 365/222; 707/821
See application file for complete search history.

(56) References Cited

U.S. PATENT DOCUMENTS

| | | | | |
|---|---|---|---|---|
| 6,289,413 | B1* | 9/2001 | Rogers et al. | 711/105 |
| 2001/0055427 | A1* | 12/2001 | Freeman | 382/233 |
| 2004/0268030 | A1* | 12/2004 | Cheung | 711/105 |
| 2007/0156946 | A1* | 7/2007 | Lakshmanamurthy et al. | 711/5 |

\* cited by examiner

*Primary Examiner* — Ali Bayat

(74) *Attorney, Agent, or Firm* — Plager Schack LLP

(57) ABSTRACT

A system and method of improving access to digital image files by combining close and activation cycles within a memory device into a single step and eliminating a pipeline delay in the process. The system and method further enhance data access efficiencies by sequential storage of successive video lines or elements of video lines in different banks with the same memory device. The techniques used to improve access to digital image data may be particularly useful when accessing digital image files that may have been rotated.

3 Claims, 3 Drawing Sheets

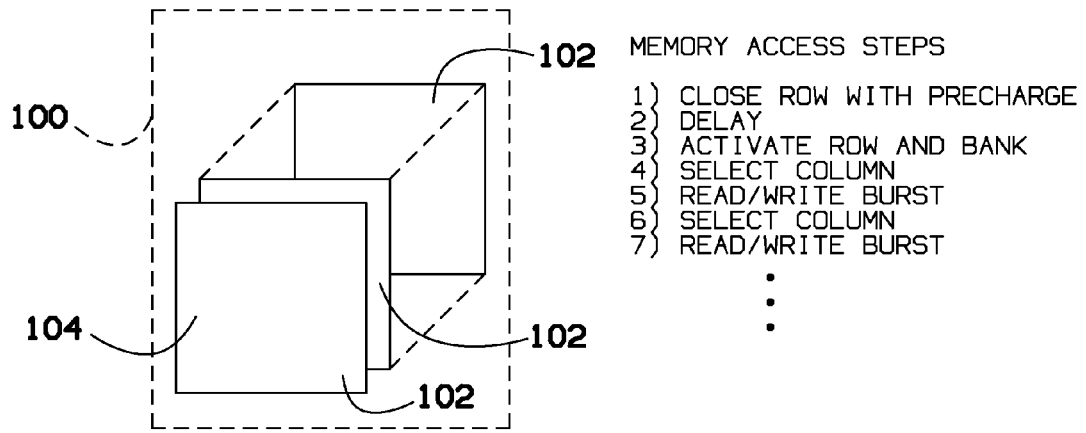

MEMORY ACCESS STEPS

1) CLOSE ROW WITH PRECHARGE
2) DELAY
3) ACTIVATE ROW AND BANK
4) SELECT COLUMN
5) READ/WRITE BURST
6) SELECT COLUMN
7) READ/WRITE BURST
   •
   •
   •

FIG. 1
(PRIOR ART)

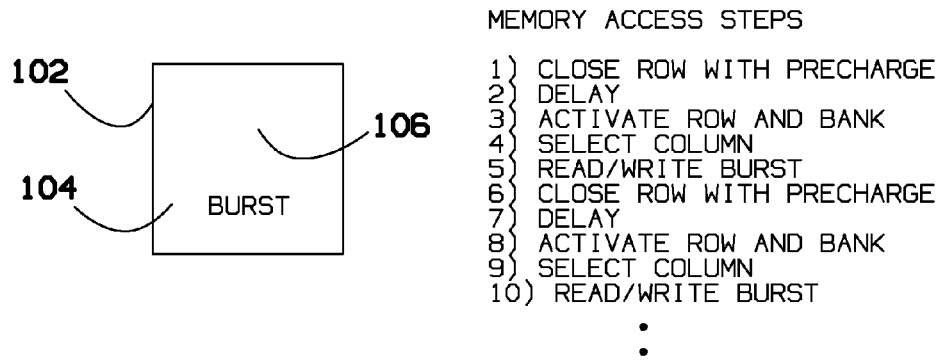

MEMORY ACCESS STEPS

1) CLOSE ROW WITH PRECHARGE
2) DELAY
3) ACTIVATE ROW AND BANK
4) SELECT COLUMN
5) READ/WRITE BURST
6) CLOSE ROW WITH PRECHARGE
7) DELAY
8) ACTIVATE ROW AND BANK
9) SELECT COLUMN
10) READ/WRITE BURST
    •
    •
    •

FIG. 2
(PRIOR ART)

MEMORY ACCESS STEPS

1) CLOSE ROW WITH PRECHARGE AND ACTIVATE ROW WITH NEW BANK
2) SELECT COLUMN
3) READ/WRITE BURST
4) CLOSE ROW WITH PRECHARGE AND ACTIVATE ROW WITH NEW BANK
5) SELECT COLUMN
6) READ/WRITE BURST
   •
   •
   •

FIG. 3

SYSTEM AND METHOD FOR MANAGING DIGITAL DATA

CROSS-REFERENCE TO RELATED APPLICATION

The present application claims priority to U.S. Provisional Application Ser. No. 61/540,927, filed on Sep. 29, 2011, the disclosure of which is incorporated herein by reference in its entirety.

BACKGROUND

Single Data Rate (SDR) synchronous dynamic random access memory (SDRAM) and Double Data Rate (DDR) SDRAM (including DDR, DDR2, DDR3, DDR4, . . . ) are various types or classes of memory integrated circuits that are used inside electronic devices to record and manage data being used by a data processing device. When these various types of SDRAM are used to handle image or video, such as when such images are rotated from their original orientation, there may be a precharge cycle or refresh delay between reads or writes to different rows inside the memory device. This presents a problem when trying to rotate images or video. Non-rotated video or image pixels are conventionally written as consecutive pixels in the same memory row without precharge cycles. A vertical read/write to pixels in an image may require a precharge delay between each pixel access. This makes it inefficient to use SDRAM memory to read or write video that is rotated 90 or 270 degrees.

Further, SDRAM memory controllers, such as DDR memory controllers, may have a pipeline delay from the time a command is sent to the controller until the time when read data (data being read from the memory device) is ready, or the memory device is ready to accept data during a write to the memory device. In a multi-port application, when more than one image is stored in the DDR memory, the pipeline delay causes a significant delay between access to different images, which reduces the effective memory bandwidth.

There is also a conventional two-pass method used to smoothly rotate images. This method may cause a loss of resolution in the rotated image, because the first pass of the conventional method typically shrinks the image being rotated.

Improvements to these conventional approaches to digital image data handling, especially for handling the rotation of digital images are desirable.

SUMMARY

The present application relates generally to methods to allow video or image data to be read/written efficiently to SDR and DDR memories. The present application relates further generally to a multi-port memory controller which may reduce or eliminate the pipeline delay between access to different images in DDR memory. The present application relates still further to the application of an expansion routine to digital image data during the first pass of a 2-pass rotation method, which may reduce or eliminate the resolution loss which occurs during the $1^{st}$ pass of the conventional method.

BRIEF DESCRIPTION OF THE FIGURES

The accompanying drawing figures, which are incorporated in and constitute a part of the description, illustrate several aspects of the invention and together with the description, serve to explain the principles of the invention. A brief description of the figures is as follows:

FIG. 1 is a diagram showing a prior art process for accessing digital image data from memory for a non-rotated digital image.

FIG. 2 is a diagram showing a prior art process for accessing digital image data from memory for a rotated digital image.

FIG. 3 is a diagram showing a process according to the present disclosure for accessing digital image data from memory.

DETAILED DESCRIPTION

Reference will now be made in detail to exemplary aspects of the present invention which are illustrated in the accompanying drawings. Wherever possible, the same reference numbers will be used throughout the drawings to refer to the same or like parts.

FIGS. 1 and 2 illustrate the conventional memory controller access method for digital video data. In FIG. 1, a non-rotated digital image is written into a memory device 100 having a plurality of banks 102. Each bank 102 has a plurality of rows 104 into which digital data may be written. As shown in the sequence of steps listed in FIG. 1, the process for writing non-rotated digital image data to memory device 100 may include closing the current active row 104 with a precharge command, before activating a different row 104 within bank 102. Each step in the listing here and elsewhere referred to in the present application represents a single clock or processor cycle within the particular memory device or processing device that is carrying out the step. FIG. 1 show the sequence of steps for activating a row 104 in a bank 102. Once the row and bank have from activated, any column in that row may be selected, and a read or write burst activity may be carried out at that memory location. A next column in the activated row and bank may be selected and another read or write burst activity can be carried out. This process would continue until the particular row is filled with video data, and another row and bank would be activated.

FIG. 2 illustrates the convention process for reading or writing rotating digital image data to a particular memory bank 102. Since the data has been rotated, the original horizontally oriented row 104 must now be written vertically. Due to the constraints of how the memory device's rows and columns may be accessed, this is not an efficient task. To read or write digital image data, the new row is activated using the steps in FIG. 2 and a column 106 selected, and a read or write burst activity may be carried out with that specific memory location. To read or write the next sequential burst of digital image data, the row immediately above or below the current row will need to be activated. So, the current row would again be closed with a precharge, another delay cycle would be experienced, another row and bank would be activated, and the same column in that new row would be selected. Then the next sequential read or write burst activity could be executed. Clearly, a conventional read or write of rotated image data adds many cycles to the memory access process.

Figure 4:
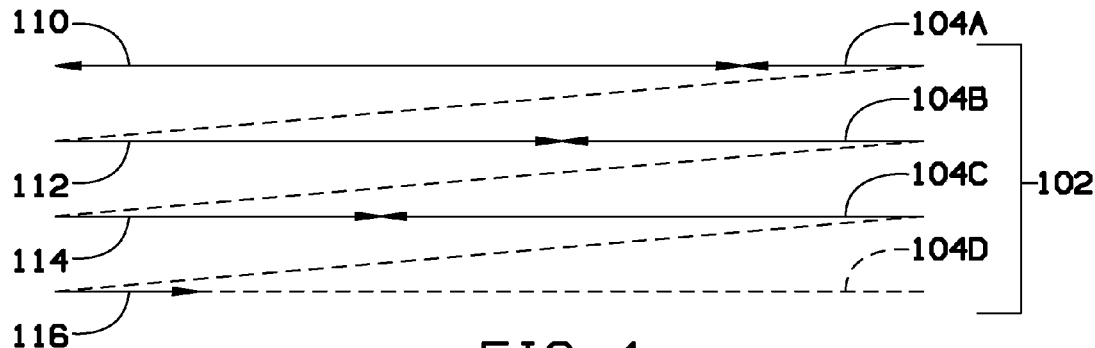
FIG. 4 is a diagram showing a prior art process for storing digital image data in a memory device, where each line of video starts immediately after the previous line of video.
Figure 5:
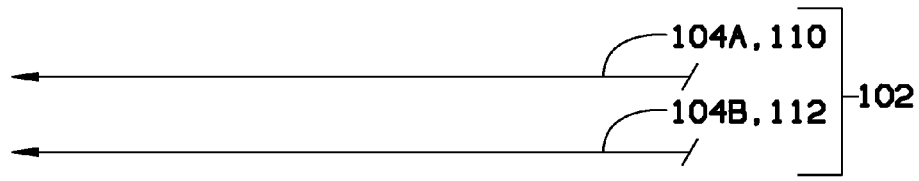
FIG. 5 is a diagram showing a prior art process for storing digital image data in a memory device, where each line of video starts at the same offset, but in a different row.

FIGS. 4 and 5 further illustrate the conventional approach and how digital image data may be stored in a memory device. A digital image data file may be broken into a plurality of video lines. Each successive line may be stored in the memory device. In FIG. 4, a plurality of sequential video lines 110, 112, 114 and 116 are to be stored in the memory device. Since the video lines may have a different length than rows 104 within a bank 102, a first row 104 may typically be filled with a complete first video line 110, and a first portion of a second video line 112. The remainder of video line 112 may be then written into a second row 104b. Again, a first portion of a third video line 114 may be written to fill out row 104b and the remainder of video line 114 would then be written into a third row 104c. The same procedure would be carried out with a fourth video line 116 and successive video lines and with a fourth row 104d and successive rows within the same bank 102 of the memory device.

FIG. 5 illustrates a similar process in this bank 102, and each row 104a and 104b contains a single video line 110 and 112, respectively.

As stated above, SDR, DDR (including DDR, DDR2, DDR3, DDR4, . . . ) memory devices may have a precharge or refresh delay between reads or writes to different rows inside the memory device. The system and method of the present disclosure may incorporate an algorithm to take advantage of the hidden precharge/refresh that is supported by most SDR and DDR memory devices.

Prior art memory controllers may have used the hidden precharge feature of memory devices to eliminate the precharge delay under some conditions: 1) If the video line is too long to fit within a single row inside the memory device, then the hidden precharge feature of the memory device may be used to continue writing to the next row in a different bank. 2) If the video line wraps around from one row to the next, as shown in FIG. 4, then the hidden precharge feature may be used when the next row is located in a different bank in the memory device.

The prior art memory controller methods may also occasionally write pixels on adjacent lines to different memory banks. But typically adjacent video lines are written to the same memory bank. When reading/writing a rotated image, the prior art memory controller must use the precharge delay process shown in FIG. 2, because there is the possibility that consecutive vertical pixels may be in rows that are located in the same memory bank.

The exemplary aspect of the present disclosure is an algorithm that always writes pixels which are at the same location on different video lines, to rows that are in different memory banks. This simple change in the memory controller eliminates the inefficient memory access shown in FIG. 2, and makes possible the efficient access to rotated video data that is shown in FIG. 3. Video data may be written as bursts to/from the memory device. Within a burst, the pixels are read/written to memory in the normal sequence of consecutive horizontal pixels. During a vertical read/write of the rotated video data, the memory controller stores the sequence of bursts in line buffers. The line buffers inside the new memory controller are random access memory. After a vertical column of data bursts are transferred from memory to the line buffers, then vertical lines of pixels can be read from the line buffers. The line buffers inside the memory controller may be double buffered or dual-ported, to support simultaneous transfers to the memory device, along with read/write access to the line buffers.

As noted above, DDR memory controllers may have a pipeline delay from the time a command is sent to the controller until the time when read data is ready, or the device is ready to accept data during a write. In a multi-port application, when more than one image is stored in the DDR memory, the pipeline delay causes a significant delay between access to different images, which reduces the effective memory bandwidth.

Referring now to FIG. 3, a memory device 200 according to the present disclosure may incorporate several of the steps of the conventional process into a single step so as to eliminate many of the wasted or delay cycles inherent in the conventional process. According to the listing of steps in FIG. 3, the system and method of the present disclosure allows for the current active row 104 that is precharged to be closed and a new row 104 to be activated in a different memory bank 102 within memory device 200 in the same step. There is thus no delay between the closing of one row and the activation of a new row. What took three cycles to accomplish in the conventional process, has been accomplished in a single cycle.

A column with the active row can then selected and a read or write burst activity carried out. To read or write the next sequential element from the digital image data, a next column in a particular row and bank will need to be identified. With the streamlined process, the current active row can be closed and the new row in a different bank 102 can be activated in a single step and the specific column within the new row can be selected in the immediate next step without a pipeline delay. What conventionally takes five cycles has been reduced to three cycles by the system and method of the present disclosure.

Figure 6:
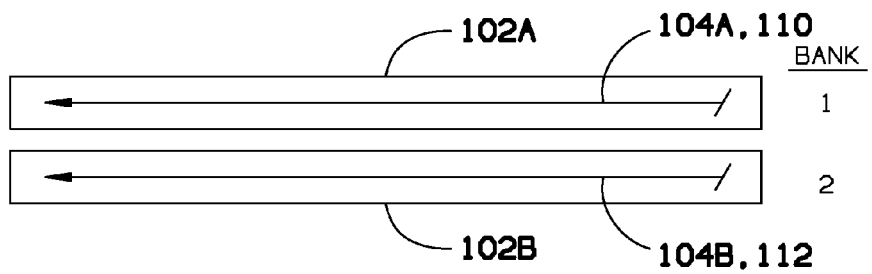
FIG. 6 is a diagram showing a process according to the present disclosure where data from consecutive lines of video are written to rows, where each row is in a different bank within a memory device.
Figure 7:
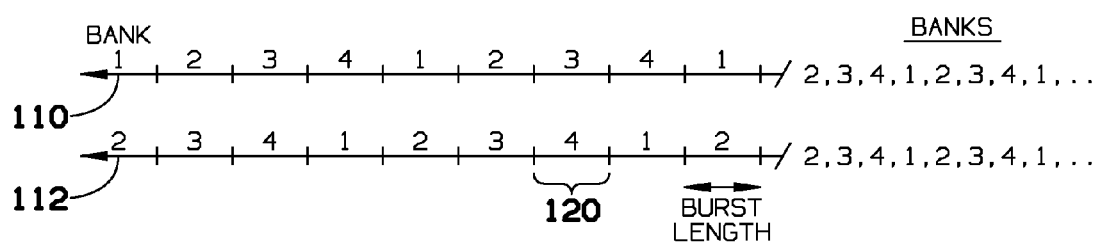
FIG. 7 is a diagram showing a process according to the present disclosure where each consecutive burst of data in the video line is written to a different bank in the memory device.

FIGS. 6 and 7 further illustrate the system and method of the present application. FIG. 6 is analogous to the arrangement of first video line 110 being stored within first row 104a and second video line 112 being stored within second row 104b. However, as noted in the FIG., row 104a is part of a first bank 102a and row 104b is part of a second bank 102b.

FIG. 7 illustrates video lines 110 and 112 broken into a plurality of sequential burst transfers 120. In this example, a left most or first burst 120 of video line 110 would be saved in a first bank 102a of memory device 100. A second burst 120 of video line 110 may be stored in a second bank 102b of device 100, a third burst 120 might be stored in a third bank 102c, and so forth until the nth successive burst 120 is stored in the nth bank 102 of device 100. If there remain more burst of video line 110 when the nth bank is accessed, then the next successive burst 120 may be written in the first bank 102a and the process begun again.

For a second video line 112, the same process may be followed but the first burst 120 would be preferably stored in a different bank from the first burst of the first video line so that the banks may be accessed and read or written to simultaneously, permitting elements of video lines 110 and 112 to be accessed in parallel, further saving processing cycles and speeding up the digital image access process.

Using the system and method of the present disclosure, a multi-port memory controller may accept an ID number along with the read/write request. This ID number may then be available with, and aligned with the data read or write request. This allows the logic that interfaces to the memory controller to be simpler and more efficient. Associating the ID number with the read/write request and having the ID number linked to the various digital images stored within the DDR memory will permit more rapid accessing of a particular digital image. Fewer cycles will be lost in the read/write process which will result in greater effective bandwidth for the memory. Since the system and method of the present disclosure will store sequential pieces of the in different banks within the memory device, access to the digital image can be improved if each piece of the same digital image data is coed with the same ID number. Cycles spent by a memory device locating the various pieces of a particular digital image's data can be reduced by simply referencing all those pieces having the ID number of the image to be retrieved.

As noted above, the conventional two pass method or process for smooth rotation of digital images causes a loss of resolution in the rotated image (as compared to the original, unrotated image), because the first pass shrinks the image. The system and method of the present disclosure may provide a solution to this issue.

The system and method of the present disclosure may also incorporate a rotation algorithm that may add an expansion to the first pass of a two pass rotation process, so the digital image data is not compressed. As noted above, conventional two pass rotation processing actually compresses the digital image to be rotated in the first pass. The amount of compression is typically dependent on the angle through which the image is to be rotated. The greatest amount of compression typically occurs when the digital image is to be rotated by an angle of approximately 45 degrees from the current vertical or horizontal of the digital image. This amount of rotation typically results in a first pass compression of approximately 0.7. By incorporating an expansion into the first pass of the two pass process, with the preferable expansion to be included ranging from approximately 1.5 or 2, the system and method of the present disclosure may have a resulting image that has no loss of resolution after the two pass rotation process is complete.

It is noted that the conventional two pass system does apply a variable degree of compression in the first pass, depending on the degree of rotation of the image to be achieved. It is anticipated that the degree of expansion applied in the first pass according to the present disclosure may be selected to be proportionate to the degree of compression applied in the conventional process.

Further, to ensure that the resulting rotated image after the two pass process has the same aspect ratio before and after processing, the rotated video may be compressed as needed after the two pass processing is complete to return the rotated digital image to the same vertical resolution as the original digital image. However, it is anticipated that close matching of the expansion in the first pass of the present disclosure with the compression of the first pass in the conventional two pass process will remove the need for such post processing compression. This may result in improved efficiency in digital image handling and processing.

The system and method of the present disclosure differs from what currently exists in that the system and method permit greater efficiency in the use of conventional SDR and DDR memory for use with digital images by storing pixels on adjacent video lines of a digital image in different memory banks. This will permit more rapid and efficient retrieval of a rotated digital image upon receipt of a read or write request. Further, use of an ID number associated with each image to be retrieved from a memory device with a multi-port memory controller, where the memory device holds a plurality of digital images, may eliminate the delay between access to different images that are stored in the same memory device. Still further, the present disclosure discloses an expansion of a digital image added during the first pass of the 2 pass rotation method that may eliminate the resolution loss caused by scaling during the first pass.

The system and method of the present disclosure may be used for rotating images and video using SDR and DDR to allow smooth and efficient video rotation to be implemented in cameras and video processors. The present disclosure also describes the use of an ID number associated with digital images and with different read/write requests to create more efficient access to different images inside the same memory devices and this approach may be used in any device that stores digital video or images. The elimination of the resolution loss during the 1st pass of the 2-pass rotation algorithm according to the present disclosure may be used in any electronic or digital image data processing product that rotates images or video. The approach of the present disclosure to ensuring the same output resolution as the input resolution for rotated digital images may be implemented in both hardware and software products that accomplish rotation of digital images that use the 2 pass method.

The system and method of the present disclosure may be implemented utilizing Field Programmable Gate Array (FPGA) firmware in a hardware descriptive language such as VHDL or Verilog. However, it is not intended to limit the scope of the present disclosure to any one particular language or environment for implementation. The algorithms of the present disclosure may be implemented as logic in an Application Specific Integrated Circuit (ASIC), or firmware inside a FPGA. The algorithms of the present disclosure may interface to an external SDR or DDR memory device using existing Input/Output hardware in the ASIC or FPGA. The logic necessary to operate the system and method of the present disclosure may be implemented in an ASIC or FPGA using a design language like Verilog or VHDL.

Figure 8:
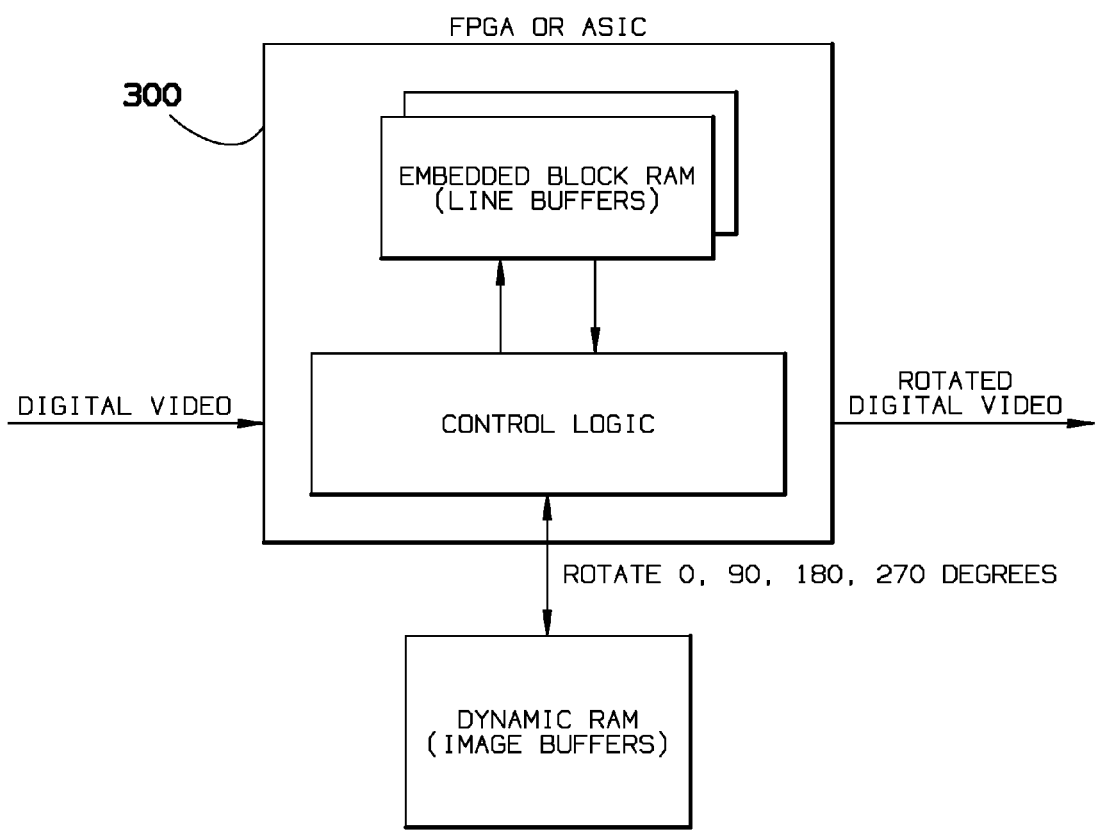
FIG. 8 is a diagram of a digital image rotation device according to the present disclosure.

FIG. 8 illustrates a device 300 that may be used to implement the system and method of the present disclosure. Device 300 may be a FPGA or an ASIC, or any similar device that may contain the code and logic necessary to execute the processes according to the present disclosure. Device 300 may be preferably optimized to handle the rotation of digital image files to orthogonal angles with respect to the original digital image so that the data read and write processes described herein can be carried out in a most efficient manner to improve speed of access to the digital image data.

The system and method of the present disclosure may be implemented using design languages like Verilog or VHDL. The design languages may then be typically compiled using software tools that generate firmware that can be loaded into a FPGA, or a logic mask for an ASIC. The implementation of the algorithms of the present disclosure in a design language like Verilog or VHDL is necessary. There are many software development tools that can be used to convert the design into firmware for an FPGA, or a layout/mask for an ASIC. The algorithms of the present disclosure may be applied to both current and future generations of SDR and DDR memory devices.

The digital image rotation aspects of the system and method of the present disclosure may be implemented as an Intellectual Property Module inside an ASIC, or FPGA, permitting low cost SDR and DDR memory devices to be used for storing digital images and video that are rotated 90 degrees. It is further anticipated that the digital image rotation aspects of the present disclosure may be incorporated directly into cameras and video processors to permit smooth video rotation.

When implemented as an Intellectual Property Module inside an ASIC or FPGA, the improved bandwidth permitted using the concepts of the present disclosure may allow efficient access to different images stored inside the same memory device. The improved efficiency in the access to different images inside the same memory devices can be used in any device that stores digital video or images.

By implementing the first pass expansion concept of the present disclosure as software in a computer, or an Intellectual Property Module inside an ASIC, or FPGA, the normal loss of resolution during the 1st pass of the 2-pass rotation method will be eliminated. It is anticipated that the method for reducing the resolution during the first pass of the 2-pass rotation algorithm can be implemented in hardware like an ASIC or FPGA, or implemented as software in a computer CPU or GPU processor.

While the invention has been described with reference to preferred embodiments, it is to be understood that the invention is not intended to be limited to the specific embodiments set forth above. Thus, it is recognized that those skilled in the art will appreciate that certain substitutions, alterations, modifications, and omissions may be made without departing from the spirit or intent of the invention. Accordingly, the foregoing description is meant to be exemplary only, the invention is to be taken as including all reasonable equivalents to the subject matter of the invention, and should not limit the scope of the invention set forth in the following claims.

What is claimed is:

1. A method for processing digital images, the method comprising:
   providing a digital memory device with a plurality of banks, each bank having a plurality of rows and columns for storing data, with a first row of a first bank being currently the active row;
   providing a digital image having a plurality of rows of data, each row including a plurality of columns of data;
   in the same cycle, closing the current active row in the digital memory device and activating a new active row in a different bank;
   in the next cycle, writing a first row of data from the digital image into the new active row of the digital memory device;
   in the next cycle, closing the current active row in the digital memory device and activating a new active row in a different bank;
   in the next cycle, writing a next sequential row of data from the digital image into the new active row of the digital memory device;
   iterating through the process of closing the current active row and activating a new active row of the digital memory device in the same cycle and then writing a next sequential row of data from the digital image into the new active row until all rows of data from the digital image have been written into rows of the digital memory device.

2. The method of claim 1, further comprising, once the digital image data has been stored in the digital memory device, in the same cycle, closing the current active row and activating a new active row in the digital memory device, wherein the first row of data from the digital image data is in the new active row;
   in the next cycle, reading the data in the current active row; then,
   in the next cycle, closing the current active row in the digital memory device and activating a new active row, wherein the next sequential new active row of data from the digital image data in is the new active row;
   in the next cycle, reading the data in the current active row;
   iterating through the process of closing the current active row and activating a new active row of the digital memory device in a single cycle wherein the next sequential row of data from the digital image data is in the new active row, and in the next cycle reading the data in the data in the new active row, until all rows of data from the digital image data have been read from the digital memory device.

3. A method for processing digital images, the method comprising:
   providing a digital memory device with a plurality of banks, each bank having a plurality of rows and columns for storing data, with a first row of a first bank being currently the active row;
   providing a digital image having a plurality of rows of data, each row including a plurality of columns of data;
   in the same cycle, closing the current active row in the digital memory device and activating a new active row in a different bank;
   in the next cycle, writing a first column of a first row of data from the digital image data into a first column of the new active row of the digital memory device;
   in the next cycle, closing the current active row in the digital memory device and activating a new active row in a different bank;
   in the next cycle, writing a next sequential column of the first row of data from the digital image data into a column in the new active row of the digital memory device;
   iterating through the process of closing the current active row and activating a new active row of the digital memory device in the same cycle and then in the next cycle writing a next sequential column from the first row of data from the digital image into a column in the new active row until all columns in the first row of data from the digital image have been written into the digital memory device;
   iterating through the process described herein for the columns of the next sequential row of data from the digital image data until all rows and columns of data from the digital image data have been written to the digital memory device.

* * * * *